Nov. 2, 1971 R. T. HEAP ET AL 3,616,533

METHOD OF PROTECTING ARTICLES IN HIGH TEMPERATURE ENVIRONMENT

Filed Oct. 28, 1969

*INVENTORS*
RICHARD T. HEAP
JOSEPH C. WIDMONT
*BY*
ATTORNEY

United States Patent Office 3,616,533
Patented Nov. 2, 1971

3,616,533
METHOD OF PROTECTING ARTICLES IN HIGH TEMPERATURE ENVIRONMENT

Richard T. Heap, Stanton, and Joseph C. Widmont, Newport Beach, Calif., assignors to North American Rockwell Corporation Filed Oct. 28, 1969, Ser. No. 874,085
Int. Cl. H05k 3/30
U.S. Cl. 29—626 13 Claims

ABSTRACT OF THE DISCLOSURE

Electrical components mounted on a printed circuit board are protected from heat by covering the components with a viscous coolant in a container conforming to the configuration of each of the components The coolant comprises a viscous liquid suspension of powdered material in water. The liquid suspension provides a heat sink and is cohesive to retain a minimum surface area upon accidental spillage on molten solder or like heated surface area whereby "flash" vaporization is avoided.

BACKGROUND OF THE INVENTION

The present invention relates to heat protection methods and apparatus and more particularly to maintaining the temperature of articles below critical temperatures when placed in a heated environment.

Use of printed circuits in large quantities has resulted in increased demand for improved methods of processing printed circuit boards. An important step in processing is application of solder to the underside of the circuit boards to make electrical connections between circuits printed on the underside of the circuit board and leads from components mounted on top of the circuit board. Some of the most efficient soldering processes involve bringing the underside of the circuit board in direct contact with a large mass or pool molten solder; e.g., dip soldering, or by passing the underside of the board in contact with a standing solder wave. These soldering methods are now in common use for applying solder to printed circuits including circuit boards on which discrete components or integrated circuit chips or modules are mounted.

The problem encountered in applying solder to printed circuit boards by the foregoing methods or by individual soldering of components to provide desired cricuit connections is that the components are often subjected to a higher temperature environment than can be tolerated without some form of protection to maintain their temperature below destructive temperature levels; e.g., certain capacitors in use have a low heat tolerance and cannot exceed 280° F. Since the ambient temperature of molten solder of basic tin and lead can be as high as 500° F. to provide proper circuit connections, it is obvious that protection of many components on the circuit board must be provided during solder application. While there are lower temperature solders of limited use the temperature is still above the critical temperature of many components. Further, a liquidus temperature of solder above the solder melting point is required for "wetting" action or diffusion at the interface to provide minimum required adherence to the printed circuits and component leads. Further, the minimum time interval that molten solder must remain in contact with the circuit board during the soldering process is dependent in part upon the temperature of the molten solder. Accordingly, reducing the temperature of the molten solder requires subjecting the circuit components to high temperatures for a longer period of time thereby resulting in greater opportunity to exceed their lower temperature tolerances.

In the prior art, protection of heat sensitive electrical circuit components mounted on printed circuit boards, during application of solder thereto, has been a tedious and time consuming operation involving the attachment of relatively large heat sink objects to individual components by wires and clips. Further, inadvertent omission of connection of some temperature sensitive components in an array on a circuit board results in heat damage thereto and consequent rejection of the entire circuit board. The present invention overcomes the difficulties involved in the foregoing and other prior art methods of heat protection of circuit components and other articles requiring protection from heat when being subjected to a high temperature environment while avoiding hazards to safety of personnel.

SUMMARY OF THE INVENTION

The methods of heat protection of the present invention comprise disposing an article in a liquid suspension to provide a heat sink for the article. In the preferred method of the present invention, electrical components are mounted on the upperside of a printed circuit board having a printed circuit on the underside. Component leads project through holes in the circuit board for solder connection to the printed circuit.

A protective film is applied over the upperside of the circuit board including components disposed thereon to hold the components in their respective positions during handling, to prevent contamination of components and board and to prevent passage of coolant from the upperside of the circuit board to circuit connections including passage through lead holes in the board. Preferably the film comprises a sheet of thermoplastic material heated to a pliable state and vacuum drawn over the upperside of the circuit board and components mounted thereon to form a container for a viscous coolant in order to immerse the components in the coolant. The coolant is a mixture of a liquid having a high specific heat and latent heat of vaporization, and the vaporization temperature is below the temperature of heat tolerance level of the components. Preferably the coolant seals pin holes or punctures in the film and maintains a suitable surface area when contacting molten solder or other objects at corresponding high temperatures to avoid "flash" vaporization and other safety hazards during soldering of the printed circuit board. An object of the method of the present invention therefore is to provide a method of heat protection having the foregoing features and advantages.

Another object of the invention is the provision of an improved method of heat protection.

A further object is to provide a method of heat protection of components on a printed circuit board during soldering.

Still another object is to provide a method of heat protection while avoiding safety hazards.

Other objects and features of the invention will become apparent to those skilled in the art as the disclosure is made in the following detailed description of a preferred embodiment of the invention as illustrated in the accompanying sheet of drawing in which:

DESCRIPTION OF THE PREFERRED EMBODIMENT OF THE INVENTION

Figure 1:
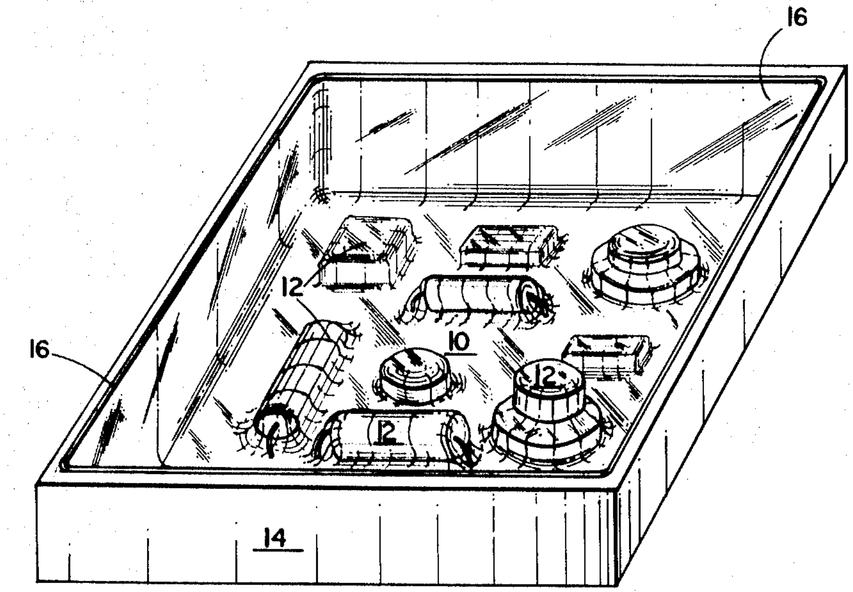
FIG. 1 is a perspective view of an enclosed printed circuit board for illustrating a preferred method of the present invention.

Referring now to the drawings for a more detailed description of the preferred method of the present invention, a printed circuit board 10, having electrical components 12 mounted thereon for connection of component leads to printed circuitry on the underside of the board, is shown disposed in an open receptacle 14 and covered by a thin thermoplastic sheet 16, for example, which has been vacuum drawn over the upperside of the circuit board.

Equipment suitable for vacuum drawing of sheet 16 over the circuit board is in common use in the packaging industry for "skin-packaging" of many different articles. This equipment or machine provides for heat-activation of the thermoplastic sheet 16 to a pliable elastic state such that it will intimately engage and conform to the upper and side surface contours of the components 12, and also the upwardly exposed surface of the circuit board 10 when the sheet is vacuum-drawn thereover. The circuit board 10 has lead-through holes therein which allows vacuum-drawing from below to pass air through the holes and thereby draw the sheet 16 down to make intimate contact with the upper side of circuit board and various contours of the components 12 as shown in FIGS. 1 and 2, for example.

Figure 2:
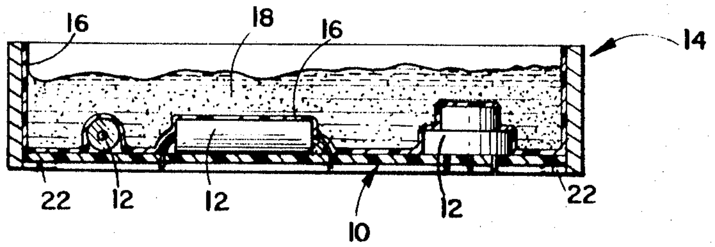
FIG. 2 is a sectional view of the enclosed circuit board shown in FIG. 1 with viscous coolant covering the circuit board and components thereon.
Figure 3:
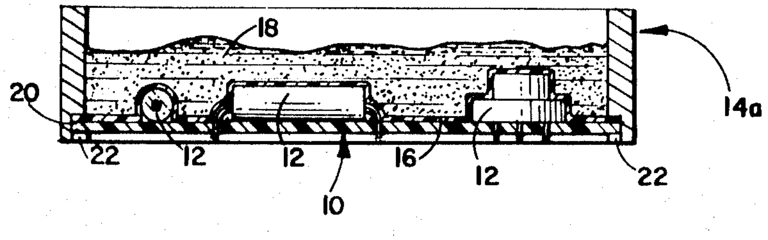
FIG. 3 is a sectional view of an enclosed circuit board illustrating an alternate arrangement for retaining a viscous coolant over the components.

The close-fitting or intimate contact with the component surfaces improves heat exchange from the components 12 and a viscous coolant 18 covering the circuit board 10 including components 12 as shown in FIG. 2. The thermoplastic sheet 16 extends past the peripheral edges of circuit board 10 to engage the inside of walls of the receptacle 14. Thus, the sheet 16 provides a liquid-tight enclosure for containing the coolant 18 at levels above the top of the highest component 12 and is supported along the vertical walls by the receptacle 14. Alternately, as shown in FIG. 3, the sheet 16 can be trimmed at the peripheral edges of the circuit board 10 and those edges seated grooves 20 formed along the walls of the receptacle **14*a*. The circuit board 10 is closely held in position by tabs 22 to produce a suitable seal between the peripheral edge of sheet 16 and the upper portion of the grooves 22 to prevent leakage of the coolant 18 from the receptacle 14*a*. In either arrangement of FIGS. 2 or 3 the coolant is contained over the circuit board 10** in a quantity to adequately assure against temperature for the time interval of exposure to the high temperature environment of the soldering process.

In addition, the sheet 16 provides a sheath or barrier over the circuit board 10 to maintain solder joint areas and holes free from contamination, which would prevent solder from entering or wetting these joints areas, for proper bonding and electrical solder connections.

The term thermoplastic sheet, is used to define those plastic sheets or films of materials that are formable and are adapted to take on a new and permanent configuration under the influence of heat and pressure. These materials include polyethylene, fluorinated ethylene polymers, polyisobutylene and vinylidenes chloride copolymers with vinyl chloride, acrylonitrile, isobutylene, or other suitable materials.

The thermoplastic sheet 16 which is vacuum drawn against the upper side of circuit board 10 serves to hold the components 12 tightly in place against the board. This facilitates handling of the circuit board 10 prior to and during the actual soldering in preventing the components 12 from being displaced from their respective position. Further, because the components are being held tightly in place on the board 10, the component leads are held in place for uniform trimming off excess lead length projecting through and past the underside of the board. Thus, the method step of vacuum-drawing of the thermoplastic sheet 16 over the board provides these latter mentioned additional advantages in the processing of printed circuit boards.

The receptacle 14 or **14*a***; i.e., side walls forming the receptacle are made from a fluorocarbon or other material having properties of insulators so as not to conduct heat and not oxidize or deform when placed in a solder pool, for example, and preferably resist adhesion of solder thereto.

The constituents of the coolant 18 and the proportions thereof are important to provide the most efficient protection of components during the time period solder is being applied to the printed circuit board 10. Primarily, a viscous coolant 18 is provided as a safety precaution to prevent the possibility of "flash" steam explosions in the event the coolant is accidently spilled or otherwise comes in contact with molten solder in the solder tank during processing of circuit boards 10. For example, should a leak or puncture occur in the sheet 16, the viscous coolant will preferably seal the leak or puncture either because of its consistency or size of particles or because of thickening or solidifying when being exposed to high temperatures causing vaporization of some or all of the liquid in the coolant directly exposed to the high temperature as a result of any leakage.

In the event leakage or spillage results in the coolant coming in contact with the molten solder, the viscosity of the coolant prevents the coolant from breaking up into particles of small surface areas; i.e., the coolant retains a surface area large enough to prevent instantaneous vaporization or "flash" vaporization of an explosive nature such as found when water, for example, is spilled on a hot surface causing spraying of extremely hot water particles and steam in all directions with resulting damage to the surroundings or injury to solder machine operators or others in the immediate area of the solder machine. In contrast, the viscous coolant used in the process of the present invention; e.g., a liquid suspension of powdered material such as flour in water forming a batter or paste of a readily flowable consistency, presents no safety hazard because the viscous coolant 18, upon contact with the surface of molten solder, merely vaporizes the liquid at a relatively slow rate and without breaking up the coolant into particles of small surface area which is the cause of the "flash" vaporization. Thus, the viscous coolant merely changes to an integrated dry paste at the interface with the molten solder to create a surface barrier between the very hot surface and the remainder of the coolant in the mass whenever the coolant comes into contact with the molten solder or surrounding surfaces at elevated temperatures above the vaporization point of the liquid in the coolant.

In addition, the liquid constituent preferably has high specific heat and a high latent heat of vaporization. Accordingly, water is one of the preferred liquid constituents of the viscous coolant in that water has a specific heat of 1 B.t.u./lb./1° F. and a heat of vaporization of 980 B.t.u./lb. Further, the vaporization point is below the lowest temperature (280° F.) of heat tolerance of the components being presently used. Thus, the heat absorption of vaporization is present long before the heat tolerance temperature level is exceeded; i.e., 280° F.−212° F.=68° F. Other less readily available or more expensive liquid constituents having the foregoing desirable properties and additional properties desirable for the specific conditions of use as a heat sink will be evident from the foregoing when considering other uses or conditions of use of the method of the present invention.

The liquid constituent is preferably mixed with a powder, solid constituent having a high moisture absorption such as flour. Other suitable powders are starch, silicon, cellulose, diatomaceous earth. In general, the class of constituents providing a suspension or dispersion for the viscous coolant includes particles and finely divided particles which absorb the liquid and cohere in the liquid suspension of flowable consistency and bond or tend to bond to maintain a large surface area when subjected to temperature approximately in the range of vaporization of the liquid. Thus, an interface barrier is formed when the coolant contacts the surface of the molten solder to prevent breaking into small particles and consequent "flash" vaporization. The interface dries very rapidly upon contact with the molten solder to provide a barrier between the hot surface and the liquid constituent; e.g., water. Further, as noted earlier, in the event pin holes or punctures are present in the film on sheet 16, the solid constituent itself or due to heat and resulting thickening or solidifying and increased coherency of the coolant in the immediate area, the coolant closes off the hole or puncture to maintain integrity of the enclosure and the sheet 16. If desired, a mixture of different particle sizes of solid constituents may be employed; e.g., finely divided particles (powders) and particles of larger size and/or fibers or fibrous material. Also, mixtures of different liquid constituents may be used to provide desirable properties for various specific applications. It should be noted in general, that a thinner consistency of the viscous coolant 18 provides more efficient cooling because of larger proportion of water by volume, but a greater possibility of leakage is present.

In the soldering process, high and low temperature solders are used depending upon the application. Most of the solder compositions include tin and lead in varying proportions which result in melting temperatures in the range of 360° to 475° F. with eutectic solder (63% tin/37% lead) having the low melting point of 362° F. The liquidus temperatures required to produce proper bonding is slightly above the melting points of the respective solder compositions. Further, proper bonding of solder and gold on gold plated leads requires diffusion of the solder and gold at the interface to create the metallurgical bond. To provide this bond at a reasonable rate or in the processing time allowed, minimum temperatures in the range of 400° F. to 425° F. are required to diffuse gold into the tin of the solder.

In summary, the method or process of the present invention comprises providing a conforming sheet on film 16 over the top of the printed circuit board 10 to prevent coolant or other contamination of the circuit board including components, leads, printed circuits and solder joints. An open receptacle 14 is formed by vertical walls thereof and the circuit board is inserted therein to be supported along the lower edges by tabs 22, as shown in FIG. 2; or by forming wall sections about the board 10 and seating the peripheral edges of the board in the grooves 20 as shown in FIG. 3. Prior to or after placement in the receptacle of the leads of components 12 are trimmed to the desired length at the underside of the board and the assembled circuit board can be stacked vertically without concern for displacement or loss of components from their respective positions on the board. Prior to soldering, the coolant 18 is poured onto the top of the printed circuit board 10 to fill the receptacle to a level above the highest component (12). After removal from the soldering processing machine or soldering by hand, the coolant and film is removed and discarded.

In light of the above teachings of the preferred embodiments disclosed various modifications and variations of the present invention are contemplated and will be apparent to those skilled in the art without departing from the spirit and scope of the invention.

What is claimed is:

1. A method of protecting an electrical component from heat comprising:

providing a coolant comprising a suspension of particles in a liquid to produce a viscous liquid suspension;

positioning an electrical component on the top side of a printed circuit board with component leads projecting through holes in said circuit board for solder connection to the printed circuit on said board and vacuum drawing a thermoplastic sheet over said electrical component and said circuit board to form a sheet over the top and at least a portion of the side surfaces of said electrical component to provide a large surface area of said electrical component adjacent said sheet on one side thereof and said coolant adjacent the other side of said sheet; and applying solder to the underside of said circuit board to solder and said component to the board, with said film and coolant being removable from said component and board after the soldering of said component to the circuit board, removing said film and coolant from the component and board.

2. The method according to claim 1 in which said sheet is formed to provide an open receptacle for containing said viscous liquid suspension.

3. The method according to claim 1 in which said viscous liquid suspension has the property of retaining a predetermined minimum surface area when subjected to temperatures above the vaporization point of the liquid.

4. The method according to claim 1 in which said viscous liquid suspension has the property of solidifying a portion thereof when reaching the vaporization point of the liquid and said vaporization point is below the temperature of heat tolerance level of said article.

5. The method according to claim 1 in which said particles comprise a powder capable of absorbing said liquid to form a liquid suspension of said powder.

6. The method according to claim 1 in which said liquid suspension comprises flour and water.

7. A method of providing heat protection for an electrical component mounted on a printed circuit board comprising:

applying a film over the component mounted on the topside of said circuit board with component leads projecting through holes in said circuit board for solder connection to the printed circuit on said board, said film being a sheet of thermoplastic material drawn tightly over the component;

a viscous coolant disposed over said component and film to provide for heat transfer from said component to said coolant; and applying solder to the underside of said circuit board solder said component to the circuit board, with said film and coolant being removable from said component and board after the soldering of said component to the circuit board; and removing said film and coolant from the component and board.

8. The method according to claim 7 in which an enclosure is provided about said circuit board, said enclosure projecting above the height of said component to retain coolant over said component.

9. The method according to claim 7 in which said viscous coolant has a readily flowable consistency to conform to the configuration of the film over said component.

10. The method according to claim 7 in which said film comprises a sheet of thermoplastic material which has been heated to a pliable state and vacuum drawn over said circuit board to conform to the top and at least a portion of the side surface of said component to provide substantial envelopment of said component by said coolant.

11. The method according to claim 7 in which said viscous coolant is prepared by mixing a liquid and finely divided particles of solid to form a liquid suspension wherein said liquid has a high specific heat and latent heat of vaporization which is below the heat tolerance level of said component.

12. The method of claim 11 in which said liquid comprises water and said solid comprises a powder selected from at least one constituent from the group consisting of flour, starch, silicon, cellulose or diatomaceous earth which is wetted by the water to have a consistency of flowable paste.

13. The method according to claim 11 in which said solid comprises a mixture of different finely divided particles.

References Cited

UNITED STATES PATENTS

| | | | |
|---|---|---|---|
| 1,615,591 | 1/1927 | Mallory | 29—487 UX |
| 2,740,193 | 4/1956 | Pessel | 29—487 |
| 2,885,601 | 5/1959 | Pessel | 29—488 X |
| 2,910,395 | 10/1959 | Cox, Jr. | 148—28 X |
| 3,374,306 | 3/1968 | Bradham | 29—627 X |
| 3,416,977 | 12/1968 | Rein | 148—125 X |
| 3,430,686 | 3/1969 | Parkison et al. | 29—488 X |
| 3,515,585 | 6/1970 | Chamberlin et al. | 29—627 X |
| 3,114,807 | 12/1963 | Koda | 29—626 UX |
| 3,388,465 | 6/1968 | Johnston | 29—626 |
| 3,520,055 | 7/1970 | Jannett | 29—626 X |

OTHER REFERENCES

Licari et al.: "Organic Coatings for Metal and Plastic Surfaces," Design Guide, May 25, 1967, pp. 176–194.

Mandel et al.: "Heat Dissipator Assemblies," IBM Technical Disclosure Bulletin, vol. 8, No. 10, March 1966.

Welsh: "Techniques of Cooling Electronic Equipment–II," reprinted from Electrical Manufacturing, 1958, entire article—10 pages.

JOHN F. CAMPBELL, Primary Examiner

R. J. SHORE, Assistant Examiner

U.S. Cl. X.R.

29—487, 488; 228—46; 317—100